United States Patent [19]

Davis

[11] 4,028,565
[45] June 7, 1977

[54] SEMICONDUCTOR VISIBLE IMAGE STORAGE DEVICE

[75] Inventor: Kenneth L. Davis, Fairfax, Va.

[73] Assignee: The United States of America as represented by the Secretary of the Navy, Washington, D.C.

[22] Filed: June 27, 1975

[21] Appl. No.: 591,191

[52] U.S. Cl. .................. 307/311; 340/173 LM; 340/173 LT; 357/26; 357/30; 358/213
[51] Int. Cl.$^2$ .................. H01L 27/20; H01L 31/00
[58] Field of Search ............ 357/26, 30; 333/30 R; 340/173 R, 173 LM, 173 LT; 358/212, 213, 294; 307/311

[56] References Cited

UNITED STATES PATENTS

| | | | |
|---|---|---|---|
| 3,826,866 | 7/1974 | Quate et al. | 357/30 |
| 3,935,564 | 1/1976 | Quate et al. | 357/26 |

OTHER PUBLICATIONS

Coldren, Appl. Phys. Lett. vol. 27, No. 1, July 1, 1975, pp. 6–8.
Coldren, Appl. Phys. Lett., vol. 25, No. 9, Nov. 1, 1974, pp. 473–475.
Grudkowski et al., Appl. Phys. Lett. vol. 25, No. 2, 15 July 1974, pp. 99–101.
Khuri–Yakub et al., Appl. Phys. Lett. vol. 25, No. 4, 15 Aug. 1974, pp. 188–190.

Primary Examiner—William D. Larkins
Attorney, Agent, or Firm—R. S. Sciascia; Philip Schneider; George A. Montanye

[57] ABSTRACT

An improved optical storage device capable of storing optical images in a charge pattern in a high-resistivity piezoelectric semiconductor layer on a semiconductor substrate. A semiconductor substrate, coated with a layer of electrically insulating material, has a layer of high-resistivity piezoelectric semiconductor covering the insulating layer and covered by a semitransparent biasing electrode. When a negative bias is applied to the electrode, and an optical pattern applied through the electrode, slow states are charged in a short interval to store, for long periods, a pattern imaged by the light. The optical pattern can then be read by using acoustic surface wave imaging techniques to provide electrical imaging of the stored optical pattern.

10 Claims, 1 Drawing Figure

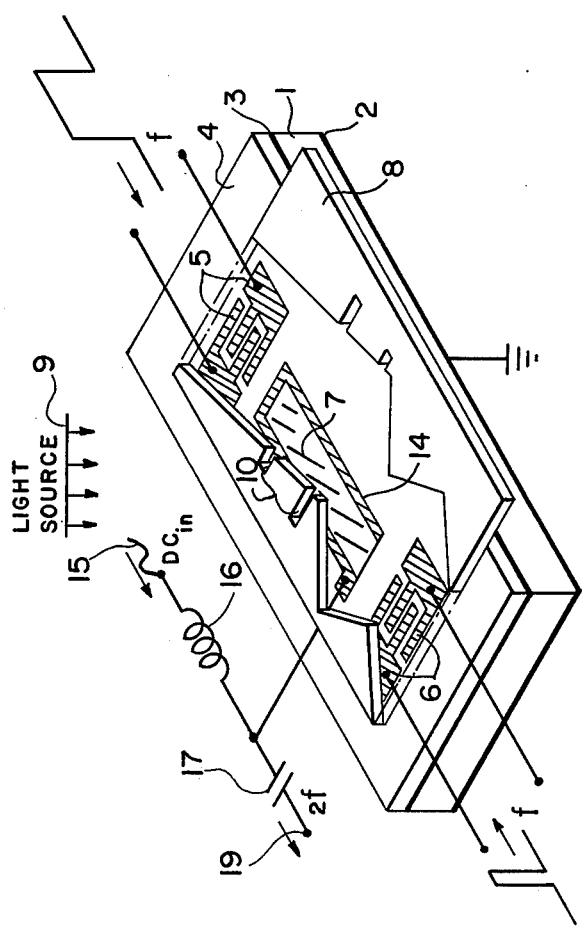

SEMICONDUCTOR VISIBLE IMAGE STORAGE DEVICE

BACKGROUND OF THE INVENTION

The present invention relates to optical storage devices and more paticularly to improved techniques for optical imaging with surface wave convolvers.

Various techniques for information storage have recently been advanced which rely on the storage of signals in depletion layers in the surface of semiconductor substrates. These techniques use structures known as charge coupled devices and have allowed many improvements in information storage and transfer. The conventional charge coupled device is constructed by mounting a metal electrode on the surface of a semiconductor with an oxide or insulator sandwiched therebetween. The application of a bias voltage across the substrate and electrode then causes a depletion layer under the electrode whose thickness, and therefore information content, is determined by the value of voltage applied. While such devices have wide applications, special structures and electrode configurations are required, thereby rendering the devices relatively complex.

Still other devices have been proposed wherein a piezoelectric semiconductor substrate is used as the storage medium for an optical image. In such devices an electrode is mounted on a piezoelectric substrate separated therefrom by an epitaxial layer. A biased voltage applied to the electrode causes charging of the substrate surface to a predetermined level beneath the Schottky barrier electrode. When an optical image is projected through the electrode, areas of the surface illuminated by the light are discharged in proportion to the light intensity while the remaining surface areas retain a charge pattern which can be read by utilizing standard acoustic surface wave techniques. While optical imaging is attained, the device requires a piezoelectric semiconductor substrate to provide optical readout, which material is not as widely available as a more common semiconductor. In addition, the device provides storage times which are relatively short, on the order of minutes, with special temperature conditions and segmented electrodes necessary for optical imaging.

While still other techniques are known which allow optical imaging and storage, each suffers from limitations on storage time and structure complexity, and none have allowed long storage times at room temperatures with nondestructive acoustic surface wave readout.

Accordingly, the present invention has been developed to overcome the specific shortcomings of the above known and similar techniques and to provide a relatively simple and inexpensive system for storing optical information.

SUMMARY OF THE INVENTION

It is therefore an object of the present invention to provide an optical storage system of reduced complexity.

Another object of the invention is to provide an optical storage device that utilizes readily available materials for increased storage times.

A further object of the invention is to provide an imaging device that facilitates readout with acoustic surface wave techniques.

Still another object of the invention is to provide an imaging system that can be constructed for nondestructive pattern imaging and readout through a single electrode.

In order to accomplish these and other objects, a semitransparent electrode is mounted on a layer of high-resistivity piezoelectric semiconductor which, in turn, is mounted on a silicon substrate having an insulating layer thereon. A negative biasing voltage is applied to the electrode while an optical system projects an image through the electrode to cause electron injection into the piezoelectric semiconductor and accumulation or depletion of surface charge in the silicon representing the optical pattern. A pair of interdigital transducers are mounted on either side of the biasing electrode to form a surface wave convolver enabling the optical pattern to be read from an output of the biasing electrode without destruction of the stored pattern. By using the more common silicon as the major substrate, the device can be constructed at less expense while providing increased storage times from the piezoelectric semiconductor charge storage. The storage and readout is accomplished with only a single electrode thereby eliminating the need for the complex structures and reading techniques so common to the prior art.

Other objects, advantages and novel features of the invention will become apparent from the following detailed description of the invention when considered with the accompanying drawing wherein:

BRIEF DESCRIPTION OF THE DRAWING

The drawing is a partial cut-away perspective view of the optical storage surface wave convolver according to the present invention.

DETAILED DESCRIPTION OF A PREFERRED EMBODIMENT

Referring now to the drawing, a schematic diagram shows a preferred embodiment of the optical storage device according to the present invention. In the present example, the device consists of a silicon substrate 1 (e.g. $n$ or $p$ type of dimensions 0.75 in. length $\times$ 0.25 in. width $\times$ 0.012 in. thickness) having opposed parallel planar surfaces. A metal film 2 of uniform thickness (e.g. 3000 A) is deposited on a first planar surface of the substrate to form an electrical connection to ground and substantially covers the entire first planar surface. On the opposed second planar surface, an electrical insulating layer 3 of uniform thickness (e.g. 1000 A) is deposited to cover substantially the entire second planar surface of the substrate 1. The layer 3 can be a thermal oxide, such as silicon dioxide ($SiO_2$), capable of protecting the silicon during subsequent deposition of layer 4 while providing sufficient insulation to allow accumulation or depletion of charge at the silicon surface at the silicon insulator interface. A high-resistivity piezoelectric semiconductor layer 4, such as zinc oxide or zinc sulfide, is coated over substantially the entire surface of the insulating layer 3 to form the storage layer of the present invention. The layer 4 may be deposited to have a uniform thickness (e.g. 1.2 microns) by any conventional sputtering technique such as that described in NRL Report No. 7737 entitled *Properties of RF Sputtered Zinc Oxide Thin Films for*

*Microwave Devices* by T. R. Larson and M. Finnley 5/29/74. Interdigital transducers 5 and 6 are deposited on the surface of the layer 4 and spaced from one another by a convolver electrode 7 also deposited on the layer 4 between the transducers 5 and 6. The interdigital transducers can be metal film deposited in any conventional manner to form inputs for generating an acoustic wave with, for example, the transducer being constructed to provide a center frequency of 171 MHz. While not shown in the drawing, metal film rectangles (e.g. aluminum) are deposited at the interface between layer 3 and layer 4 directly under each transducer's active region to enable the generation of an acoustic surface wave as is known in the art. The convolver electrode 7 can be a deposited semitransparent metal layer of uniform thickness (e.g. aluminum at 125 A) which is partially transparent to white light or at least to light wavelengths providing the optical pattern for storage. The electrode 7 is constructed to have an integral narrow strip 14 generally extending around the periphery of the electrode (for rectangular electrode of 0.9mm by 1.5mm) having a thickness of about 2000 A to provide improved electrical conduction to the electrode 7. While not specifically described, the layers 2, 3, 5 to 7 and 14 may be deposited in any well known manner for the particular material involved. Techniques for depositing such layers are adequately described in the prior art and are therefore not considered necessary to an understanding of the present invention.

In the present example, the optical system for projecting an image to be stored is represented by the opaque mask 8 and the light source 9. The light source 9 projects white light through openings 10 in the mask 8 positioned such that the openings 10 form the optical pattern on the convolver electrode 7. While this specific configuration generates an optical image for storage, the optical system is not only limited to the specific structure but may be formed by other techniques as will be subsequently mentioned.

The operation of the inventive system will now be described with reference to the drawing. In order to image light according to the present invention, and provide a stored optical pattern, the light source 9 is positioned to direct light through the openings 10 in the mask 8 to form an optical pattern on the convolver electrode 7 defined by the openings 10. At the same time, a negative D.C. bias voltage is applied to an input lead 15 to the convolver electrode 7 through an isolating inductance 16. When a pattern of light is projected through the semitransparent negatively biased electrode, electrons are injected from the metal into the zinc oxide layer 4 in the illuminated regions. Traps in the layer 4 capture and store the injected electrons which create an identical charge pattern in the silicon surface at the $SiO_2$ interface. The areas of injected electrons in the layer 4 constitute the charge pattern that represents the stored optical image. It has been found that by using specific high-resistivity piezoelectric semiconductor materials such as zinc oxide or zinc sulfide to form the layer 4, charge is stored for much longer periods of time than for prior known devices. It should be particularly noted that the piezoelectric semiconductor material of the present invention must have a resistivity of such value that electrons injected by the electrode 7 will be stored to form the charge pattern. This is in contrast to prior known structures where piezoelectric semiconductor materials have been used as a photoconductive layer to form a variable resistor for changing voltage magnitudes applied to a semiconductor substrate which voltages determine the depth of the depletion layer of the substrate.

The present device and the theory behind the storage phenomena are described in the article "Storage of Optical Patterns in a Zinc-oxide-on-silicon Surface Wave Convolver" by K. L. Davis, *Applied Physics Letters* Vol. 26, No. 4, 2/15/75, pp 143–145, which article is hereby incorporated by reference. Generally, however, it appears that slow states are present throughout layer 4 or at the interface of the layer 3 and the layer 4 which become filled with electrons when a negative bias is applied to the electrode 7. This causes an accumulation or depletion of charges in the silicon surface (dependent on the particular silicon substrate doping type) at the interface of layers 1 and 3, which are retained as long as the slow states remained charged. While normally the charging takes a relatively long period of time at negative bias levels with magnitudes greater than zero but less than 15 volts, the exposure of the electrode 7 to light according to the present invention, accelerates the charging rate such that the slow states are charged only in the illuminated regions defined by the patterned openings 10. These charge states then retain the optical pattern, even after the biasing potential is removed, for periods of time which can exceed several days.

Once having stored the optical pattern in the layer 4, the optical image can be retrieved using an acoustic surface wave convolution technique such as that described in *Applied Physics Letters* Vol. 25, No. 4, 8/15/74, pp. 178 by H. Hayakawa and G. S. Kino or in *Applied Physics Letters* Vol. 25, No. 2, 7/15/74, pp 99–101 by T. W. Grudkowski and C. F. Quate. In such techniques a long RF pulse (greater in width than twice the delay time through electrode 7) is inserted at one transducer 5 and a short RF scanning pulse (about $0.2\mu sec$ pulse width depending on resolution and efficiency desired) inserted at the other transducer 6. The pulses at 5 and 6 are both at the same frequency f(171 MHz) and produce a convolution output signal at 19 through blocking capacitor 17 at a frequency of $2f$ which represents the optical pattern. The length of the output signal is the time it takes the scanning pulse to travel the length of the convolver electrode 7. As the scanning pulse passes through the illuminated regions, the changes in silicon surface charge density can be observed as changes in the convolution output amplitude from the electrode 7. Since the areas illuminated by light have different convolution efficiency than those not illuminated, the electrical output will be a different amplitude signal at the positions representing the light pattern. Since the convolution efficiency varies with light intensity, the device enables various shades to be continuously represented by changing amplitudes to reproduct a light pattern. By way of example, it has been found that with a layer 4 of ZnO and a bias voltage of negative 15 volts, an optical image formed with white light could be retained and nondestructively read for periods exceeding 2 days.

While increased storage times have been achieved with the present system, erasure prior to device discharge is difficult to achieve. In this regard, an alternaive embodiment suggests that erasure might be more easily achieved by replacing the $SiO_2$ layer 3 with a thin (10–100 A) $SiO_2$ layer and depositing a 1000 A insulating layer (e.g. $SiO_2$ or $Al_2O_3$) between the layer 4 and the electrode 7. In this embodiment the 1000A insulating layer would block charge injection into the zinc oxide from the electrode 7. Instead, the charge would be injected into the zinc oxide by tunnelling through the 10-100A $SiO_2$ layer from the silicon substrate by using optical illumination as described above in combination with a dc bias applied to the electrode 7. Erasing could then be obtained by injecting opposite charge into the ZnO layer through the 10-100A $SiO_2$ layer from the silicon substrate by applying a dc bias with opposite polarity to that used for charging.

As can be seen from the above description, the present invention provides an optical imaging and retrieval system that provides increased storage times and efficient nondestructive acoustic surface wave readout through a single semitransparent electrode. By using a common silicon substrate the system can be easily fabricated using conventional integrated circuit techniques and is capable of storing optical images for sveral days at room temperature without severe environmental restrictions or complex electrical structures. All of these are advantages not found in prior known techniques as previously described.

While the invention has been described with reference to a particular mode of operation the device could also be used to obtain the convolution or correlation of two coded signals, one of which is stored by an appropriate light pattern and the other of which is a coded signal replacing the scanning pulse. The output would then be a convolution or correlation of the two signals without time compression or the need for synchronization so common to prior art techniques. It should be noted that the semi-transparent electrode could be aluminum, gold or any other material having high transparency to light at the desired wavelengths, and high electrical conductivity. Likewise the opaque mask could be replaced by a shaded mask allowing continuous variation of the light intensity to form an optical pattern. Alternatively, a lens system would be used to focus a light pattern passed by such a mask to expand or compress the optical image on the electrode 7. In the same manner, an amplitude modulated light source could be scanned across the electrode surface to produce a desired image. The optical image could additionally be retrieved by using other surface acoustic wave techniques such as that described in *IEEE Transactions on Sonics and Ultrasonics* Vol. Su-21, No. 4, 10/74, pp 283-288.

Obviously many other modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. An optical storage system comprising:
   a semiconductor substrate having first and second surfaces;
   a metal film deposited over the first surface and coupled to ground;
   an insulating layer deposited over the second surface;
   a piezoelectric semiconductor layer deposited over the surface of the insulating layer having a resistivity enabling the storage of charge patterns;
   a semitransparent electrode layer coupled to the surface of said piezoelectric semiconductor layer;
   means for applying a bias voltage across said electrode and ground; and
   means for projecting an optical image through said semitransparent electrode such that a charge pattern is injected and stored in said piezoelectric layer causing a corresponding accumulation or depletion of charge in said semiconductor substrate.

2. The system of claim 1 further including,
   a first acoustic surface wave transducer coupled to said piezoelectric semiconductor layer;
   a second acoustic surface wave transducer coupled to said piezoelectric semiconductor layer and positioned such that said electrode is located between said first and second transducers;
   an output terminal coupled to said electrode; and
   means coupled to electrically pulse said transducers to generate acoustic surface waves in said piezoelectric semiconductor layer to provide an electrical signal at said output terminal representing said stored optical image.

3. The system of claim 2 wherein said means for applying a bias voltage comprises a source of negative potential.

4. The system of claim 3 wherein said piezoelectric semiconductor is zinc oxide.

5. The system of claim 3 wherein said piezoelectric semiconductor is zinc sulfide.

6. An optical storage system comprising:
   a semiconductor substrate having first and second surfaces;
   a metal film deposited over the first surface and coupled to ground;
   an insulating layer deposited over the second surface;
   a piezoelectric semiconductor layer deposited on the surface of the insulating layer having a resistivity enabling the storage of charge patterns;
   a first acoustic surface wave transducer coupled to said piezoelectric semiconductor layer;
   a second acoustic surface wave transducer coupled to said piezoelectric semiconductor layer and positioned such that said electrode is located between said first and second transducers;
   a semitransparent electrode coupled to the surface of said piezoelectric semiconductor layer between said transducers;
   an insulating layer deposited between said electrode and said piezoelectric semiconductor layer to enable charge to be injected into said piezoelectric semiconductor from said substrate;
   an output terminal coupled to said electrode;
   means for applying a negative bias voltage across said electrode and ground;
   means for projecting an optical image through said semitransparent electrode so that a charge pattern is injected and stored in said piezoelectric layer causing a corresponding accumulation or depletion of charge in said semiconductor substrate; and
   means coupled to electrically pulse said transducers to generate acoustic surface waves in said piezoelectric layer to provide an electrical signal at said output terminal representing said stored optical image.

7. A method of controlling optical imaging comprising:
   depositing a metal film on a first surface of a semiconductor substrate and coupling the film to ground;

depositing an insulating layer on a second surface of said semiconductor substrate;

depositing a piezoelectric semiconductor material on the surface of said insulating layer having a resistivity enabling the storage of charge patterns;

coupling an electrode to said piezoelectric semiconductor material;

connecting a bias source between said electrode and ground; and storing an optical pattern by projecting an optical image through said semitransparent electrode so as to inject a charge pattern into said piezoelectric layer corresponding to said optical image and causing a corresponding accumulation or depletion of charge in said semiconductor substrate.

8. The method of claim 7 further including the step of reading said optical pattern by introducing acoustic surface waves in said piezoelectric semiconductor material to provide an electrical output from said electrode representing said optical image.

9. A method of controlling optical imaging comprising:

depositing a metal film on a first surface of a semiconductor substrate and coupling the film to ground;

depositing an insulating layer on a second surface of said semiconductor substrate;

depositing a piezoelectric semiconductor material on the surface of said insulating layer having a resistivity enabling the storage of charge patterns;

coupling an electrode to said piezoelectric semiconductor material;

depositing a layer of insulating material between said electrode and piezoelectric semiconductor material to enable charge to be injected into said piezeoelectric material from said semiconductor substrate;

connecting a bias source between said electrode and ground; and storing an optical pattern by projecting an optical image through said semitransparent electrode so as to inject a charge pattern into said pizoelectric layer corresponding to said optical image and causing a corresponding accumulation or depletion of charge in said semiconductor substrate.

10. The method of claim 9 further including the step of erasing said stored charge pattern by replacing said bias source with a source of opposite polarity to inject charges of opposite polarity into said piezoelectric semiconductor material from said semiconductor substrate.

* * * * *